US012633941B2

(12) United States Patent
Guerra et al.

(10) Patent No.: US 12,633,941 B2
(45) Date of Patent: May 19, 2026

(54) DIFFERENTIAL IDAC FOR PPG APPLICATIONS

(71) Applicant: STMicroelectronics International N.V., Geneva (CH)

(72) Inventors: Ranieri Guerra, S. Giovanni la Punta (IT); Angela Bruno, Catania (IT)

(73) Assignee: STMicroelectronics International N.V., Geneva (CH)

( * ) Notice: Subject to any disclaimer, the term of this patent is extended or adjusted under 35 U.S.C. 154(b) by 138 days.

(21) Appl. No.: 18/754,592

(22) Filed: Jun. 26, 2024

(65) Prior Publication Data

US 2026/0005704 A1      Jan. 1, 2026

(51) Int. Cl.
H03M 3/00          (2006.01)
H03F 3/45          (2006.01)
H03G 3/30          (2006.01)

(52) U.S. Cl.
CPC .......... H03M 3/50 (2013.01); H03F 3/45475 (2013.01); H03G 3/30 (2013.01); *H03G 2201/103* (2013.01)

(58) Field of Classification Search
CPC ........ H03F 3/45475; H03F 3/50; H03F 3/505; H03G 3/30; H04L 7/00; H03M 3/50
USPC .................................................. 341/144, 143
See application file for complete search history.

(56) References Cited

U.S. PATENT DOCUMENTS

| | | | |
|---|---|---|---|
| 7,268,711 B1 | 9/2007 | Hofer | |
| 2013/0147548 A1* | 6/2013 | Ikeda | H03F 1/34 |
| | | | 330/75 |
| 2014/0340150 A1 | 11/2014 | Dempsey | |
| 2016/0380595 A1 | 12/2016 | Finlinson | |
| 2018/0059706 A1 | 3/2018 | Kim | |
| 2019/0155323 A1 | 5/2019 | Kim | |
| 2023/0121521 A1* | 4/2023 | Hsu | H03F 3/45959 |
| | | | 375/262 |
| 2023/0299575 A1 | 9/2023 | Singleton | |
| 2024/0364267 A1* | 10/2024 | Zeng | H03F 1/3223 |

* cited by examiner

*Primary Examiner* — Peguy Jean Pierre
(74) *Attorney, Agent, or Firm* — Slater Matsil, LLP

(57) ABSTRACT

According to an embodiment, a differential current digital-to-analog converter (IDAC) proposed. The differential IDAC includes first and second reference resistors respectively coupled to a voltage supply rail and reference ground. A reference current source is positioned between the two reference resistors. The converter also features first and second variable resistors, both coupled to the voltage supply rail, with resistance values based on respective digital codes. Additionally, a p-channel transistor sources a first output current from the first variable resistor to a first output terminal, while an n-channel transistor sources a second output current from the second variable resistor to a second output terminal. The system includes amplifiers to ensure voltage equality across both pairs of reference and variable resistors, thereby stabilizing the output currents.

20 Claims, 5 Drawing Sheets

DIFFERENTIAL IDAC FOR PPG APPLICATIONS

TECHNICAL FIELD

The present disclosure generally relates to an electronic system for healthcare monitoring and, in particular embodiments, to a differential digital-to-analog converter with current output for photoplethysmography (PPG) applications.

BACKGROUND

Photoplethysmography (PPG) is a simple and low-cost optical measurement technique that can detect blood volume changes in the microvascular bed of tissue. Generally, it utilizes a light emitter, such as a light-emitting diode (LED), to emit light that passes through the skin and is absorbed by the tissues and blood vessels underneath. The amount of light either absorbed or reflected depends on the volume of blood circulating in the tissue; more blood presence leads to more light absorption and less light reflected.

A photodiode detector is positioned adjacent to or opposite the light emitter to capture the reflected light that has not been absorbed by the tissue and blood. The intensity of the collected light varies with the cardiac cycle. When the heart pushes blood into the periphery during systole, the volume and subsequent absorption increase, leading to less light reaching the photodiode. Conversely, more light is reflected to the detector during diastole when less blood volume is present. The resulting signal is an alternating waveform corresponding to each heartbeat, which can be analyzed to determine various physiological parameters such as heart rate, blood oxygen saturation, and cardiac output with additional processing.

PPG measurements can be taken at various sites on the body, typically at peripheral sites such as the fingertips, earlobes, or toes, where the vascular tissue is abundant and close to the surface.

The advantage of PPG is that it can provide valuable data non-invasive, allowing for continuous monitoring of cardiovascular health in various settings, from clinical to fitness and wellness scenarios. Moreover, advancements in technology enable PPG sensors to be incorporated into wearable devices like smartwatches and fitness trackers, providing users real-time access to their physiological data.

One of the intrinsic challenges of PPG technology is acquiring a useful AC signal, which is inherently very small and can be easily obscured by extraneous signals. A critical aspect of enhancing signal detection involves two main processes: the cancellation of the ambient light component (ALC), which constitutes unwanted noise, and the reduction of the DC component, which can mask the AC signal of interest.

The effectiveness of these two signal enhancement processes often hinges on the precise control of variable current sources. The current sources are tasked with nullifying the undesirable portions of light that can interfere with accurately detecting the PPG signal. Integrating the variable current sources in practice can be difficult, especially considering configurations where the receiving (RX) chain is fully differential.

Accordingly, the predominant challenge in designing a fully differential receive chain for PPG applications is achieving high fidelity in current matching between the two differential branches across various temperatures, as any discrepancy can lead to inaccuracies in signal interpretation.

Further, introducing this level of precision is to be accomplished without contributing significant noise to the system.

SUMMARY

Technical advantages are generally achieved by embodiments of this disclosure, which describe a differential digital-to-analog converter with current output for photoplethysmography (PPG) applications.

A first aspect relates to a differential current digital to analog converter (IDAC). The differential IDAC comprises a first reference resistor coupled to a voltage supply rail; a second reference resistor coupled to reference ground; a reference current source arranged between the first reference resistor and the second reference resistor; a first variable resistor coupled to the voltage supply rail, the first variable resistor having a first resistance value based on a first digital code; a second variable resistor coupled to the voltage supply rail, the second variable resistor having a second resistance value based on a second digital code; a p-channel transistor configured to source a first output current from the first variable resistor to a first output terminal; an n-channel transistor configured to source a second output current from the second variable resistor to a second output terminal; a first amplifier configured to cause a first voltage across the first variable resistor to equal a first voltage across the first reference resistor; and a second amplifier configured to cause a second voltage across the second variable resistor to equal a second voltage across the second reference resistor.

A second aspect relates to a system that includes a detector configured to capture light and generate an electrical signal: a photoplethysmography (PPG) circuit coupled to the detector, the PPG circuit configured to receive the electrical signal and generate compensation current for ambient light components of the electrical signal, the PPG circuit comprising: a first reference resistor coupled to a voltage supply rail; a second reference resistor coupled to reference ground; a reference current source arranged between the first reference resistor and the second reference resistor; a first variable resistor coupled to the voltage supply rail, the first variable resistor having a first resistance value based on a first digital code; a second variable resistor coupled to the voltage supply rail, the second variable resistor having a second resistance value based on a second digital code; a p-channel transistor configured to source a first output current from the first variable resistor to a first output terminal; an n-channel transistor configured to source a second output current from the second variable resistor to a second output terminal; a first amplifier configured to cause a first voltage across the first variable resistor to equal a first voltage across the first reference resistor; and a second amplifier configured to cause a second voltage across the second variable resistor to equal a second voltage across the second reference resistor.

A third aspect relates to a method to generate a differential current to reduce an ambient light component in an electrical signal corresponding to a photoplethysmography (PPG) signal measurement. The method includes sourcing, by a p-channel transistor, a first output current from a first variable resistor to a first output terminal, the first variable resistor coupled to a voltage supply rail, the first variable resistor having a first resistance value based on a first digital code; sourcing, by an n-channel transistor, a second output current from a second variable resistor to a second output terminal, the second variable resistor coupled to the voltage supply rail, the second variable resistor having a second resistance value based on a second digital code; setting, by a first amplifier, a first voltage across the first variable resistor to equal a first voltage across a first reference resistor, the first reference resistor coupled to the voltage supply rail; and setting, by a second amplifier, a second voltage across the second variable resistor equal a second voltage across a second reference resistor, the second reference resistor coupled to reference ground, a reference current source arranged between the first reference resistor and the second reference resistor.

Embodiments can be implemented in hardware, software, or any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise. Various embodiments are illustrated in the accompanying drawing figures, where identical components and elements are identified by the same reference number, and repetitive descriptions are omitted for brevity.

Variations or modifications described in one of the embodiments may also apply to others. Further, various changes, substitutions, and alterations can be made herein without departing from the spirit and scope of this disclosure as defined by the appended claims.

Figure 1:
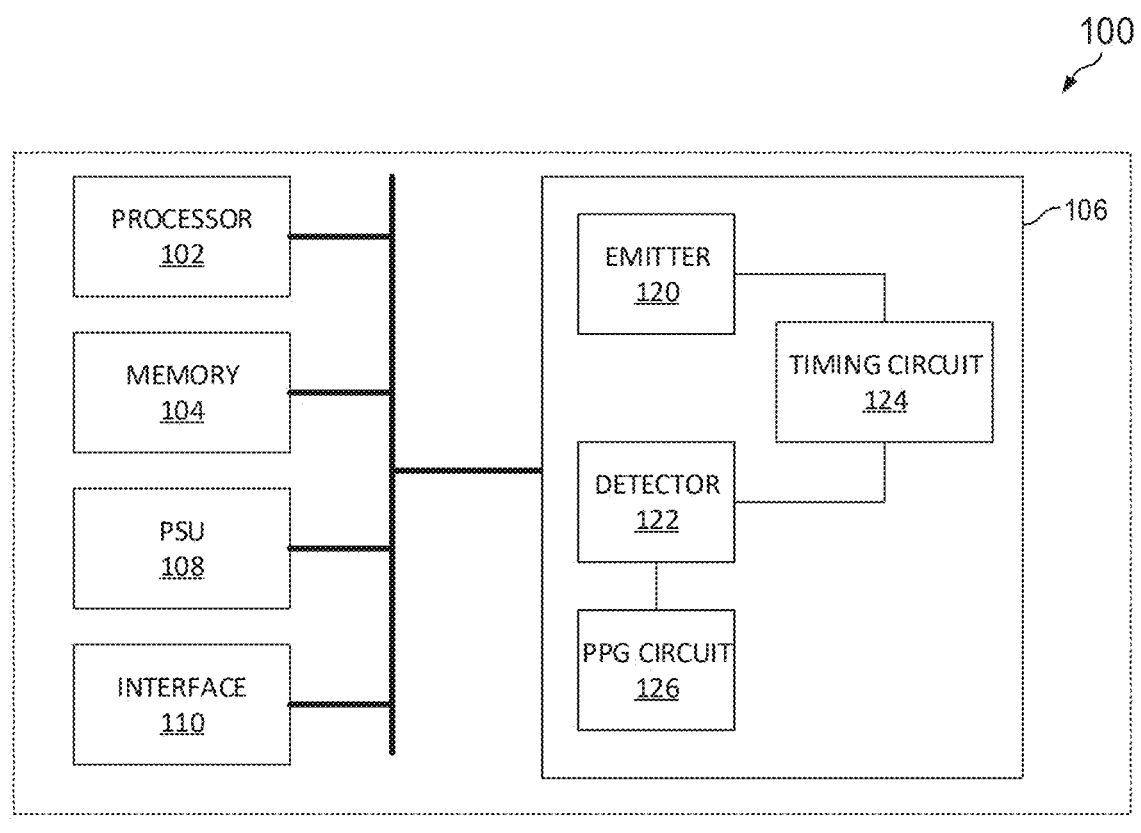
FIG. 1 is a block diagram of an embodiment system for Photoplethysmography (PPG) measurements.

FIG. 1 illustrates a block diagram of an embodiment system 100 for Photoplethysmography (PPG) measurements. System 100 includes a processor 102, a memory 104, a sensor 106, a power supply unit (PSU) 108, and an interface 110, which may (or may not) be arranged as shown. Although one of each (i.e., the processor 102, the memory 104, the sensor 106, the power supply unit 108, and the interface 110) is shown in FIG. 1, the number of components is not limiting, and greater numbers are similarly contemplated in other embodiments. System 100 may include additional components not depicted, such as long-term storage (e.g., non-volatile memory, etc.), power management circuitry, security and encryption modules (e.g., trusted platform modules (TPM), etc.), or the like.

System 100 may be an electronic device, such as a smartwatch, fitness tracker, medical device (e.g., pulse oximeters), wristband, sports band, smart ring, earbuds, or any device capable of hosting the sensor 106.

In embodiments, each component can communicate with any other component internally within or external to the system 100. For example, each component can communicate using the I2C (Inter-Integrated Circuit), alternatively known as I2C or IIC, communication protocol, the I3C (Improved Inter Integrated Circuit) communication protocol, the serial peripheral interface (SPI) specification, or the like.

Processor 102 may be any component or collection of components adapted to perform computations or other processing-related tasks. In embodiments, processor 102 is an application processor, a baseband processor, or a microcontroller. In embodiments, processor 102 is configured to provide control signals for the timing circuit 124 to control the timing of the emission and detection of light by emitter 120 and detector 122.

Memory 104 may be any component or collection of components adapted to store programming, instructions, or calibration settings for execution or retrieval by processor 102. In an embodiment, memory 104 includes a non-transitory computer-readable medium.

Sensor 106 may be any component or collection of components adapted for PPG measurements. In embodiments, sensor 106 includes an emitter 120, a detector 122, a timing circuit 124, and a PPG circuit 126, which may (or may not) be arranged as shown. Sensor 106 may include additional components not shown, such as memory, a dedicated microcontroller, and a driver.

Generally, sensor 106 can be set up in transmittance or reflectance modes. In the transmittance mode, the emitter 120 and the detector 122 are placed on opposite sides of the measuring site (e.g., fingertip or earlobe), and the detector 122 measures the light that has passed through the tissue. In the reflectance mode, the emitter 120 and detector 122 are placed on the same side of the measuring site, and the detector 122 measures the light reflected from tissues underneath.

Emitter 120 is configured to emit light at specific wavelengths toward the skin to penetrate the skin and tissue. As the emitted light travels through the skin, tissue, and blood vessels, some is absorbed while the rest is scattered or reflected. The amount of light absorbed varies with the pulsatile changes in blood volume due to cardiac cycles. The varying absorption caused by the changing blood volume (due to the heartbeat) alters the intensity of light either transmitted through or reflected from the tissue. This alteration forms the basis of the PPG signal. Emitter 120 can be, for example, light-emitting diodes (LEDs) or laser diodes.

Detector 122 is configured to capture the light that has either passed through (transmittance mode) or reflected (reflectance mode) from the body's tissue. Once the light reaches detector 122, it is converted into an electrical signal using the photoelectric effect, where photons hitting the detector 122 cause electrons to be released, resulting in a measurable current. Detector 122 can consist of, for example, photodiodes or photodetectors sensitive to the specific wavelengths of light emitted by the emitter 120.

The timing circuit 124 is configured to synchronize the emission of light by emitter 120 and the detection of the light by detector 122. In embodiments, timing circuit 124 may include a dedicated memory and controller to operate the operations of the sensor 106. However, in embodiments, the processor 102 and memory 104 of the host device may be used to control the operation of the sensor 106.

The PPG circuit 126 is configured to receive the differential electrical signal from the detector 122, generate compensation currents for the DC and ambient light components of the electrical signal, amplify the electrical signal, and isolate the PPG signal from unrelated signals or noise to improve the signal-to-noise ratio.

PPG circuit 126 includes a differential digital-to-analog converter with a current output (IDAC) configured to generate the compensation circuits. In embodiments, PPG circuit 126 includes two IDACs that are independently controlled and can generate currents for each of the ambient light and DC components of the electrical signal.

Once detector 122 converts the light to an electrical signal, the PPG circuit 126 converts the analog electrical signal to a digital signal, which is processed and analyzed by, for example, the processor 102 of the host device. Concurrently, PPG circuit 126 is configured to provide the compensation currents to remove unwanted Ambient Light Component (ALC) and the DC component of the PPG signal, further detailed below.

In embodiments, processor 102 receives data from sensor 106, interprets it, and converts it into usable biometric information, such as heart rate, heart rate variability, blood oxygen saturation (SpO2), and blood pressure trends. In embodiments, processor 102 is configured to alert a user of an anomaly related to the PPG measurement through interface 110. Processor 102 may apply signal processing algorithms to refine the data, compensating for factors like ambient light noise or object reflectivity variations to provide more reliable information.

Power supply unit 108 may be any component or collection of components that provide power to one or more components within the system 100. Power supply unit 108 may include various power management circuitry, charge storage components (i.e., battery), and the like.

Interface 110 may be any component or collection of components that allow processor 102 to communicate with other devices/components or a user.

Figure 2:
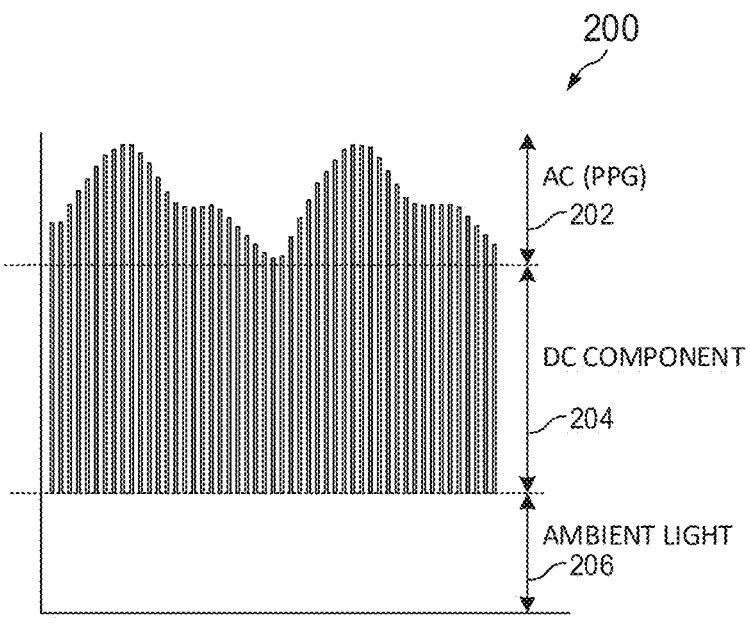
FIG. 2 is a plot of an example electrical signal from the detector.

FIG. 2 illustrates a plot of an example electrical signal 200 from the detector 122. After the photodetection process, the electrical signal 200 produced by detector 122 represents the various components of light intensity interacting with the blood flow in the tissue. As blood is pumped through the vessels by the heart, it causes pulsatile changes in the blood volume within the tissues. These changes modulate the intensity of the light received by the detector 122, resulting in an electrical signal with both time-varying (alternating current, AC) and non-varying (direct current, DC) components.

The AC component 202 of the electrical signal 200 is particularly interesting because it directly corresponds to the pulsatile blood volume changes-essentially, it reflects the heart's rhythmic beating. This AC component 202 is typically relatively small relative to the electrical signal 200, often representing less than 1% of the total detected signal; however, it carries the information needed to assess cardiovascular health and other physiological parameters.

On the other hand, the DC component 204 represents non-pulsatile elements of the electrical signal 200, including the baseline light absorption by the tissue, skin, bones, and non-pulsatile blood. This DC component 204 is much larger than the AC component 202 but doesn't carry information about the heart's pulsations. To isolate the AC component 202 of the electrical signal 200 and improve measurement accuracy, PPG circuit 126 is configured to cancel out or minimize the impact of the DC component 204.

An ambient light component (ALC) 206 also contributes to the electrical signal 200. The ambient light component 206 includes extraneous light from the environment that is not generated by the emitter 120 but reaches the detector 122 nonetheless. The ambient light component 206 can introduce significant measurement errors because it can vary with changes in environmental lighting conditions and may add noise to the electrical signal 200. To isolate the AC component 202 of the electrical signal 200 and improve measurement accuracy, PPG circuit 126 is configured to cancel out or minimize the impact of the ambient light component 206.

Figure 3:
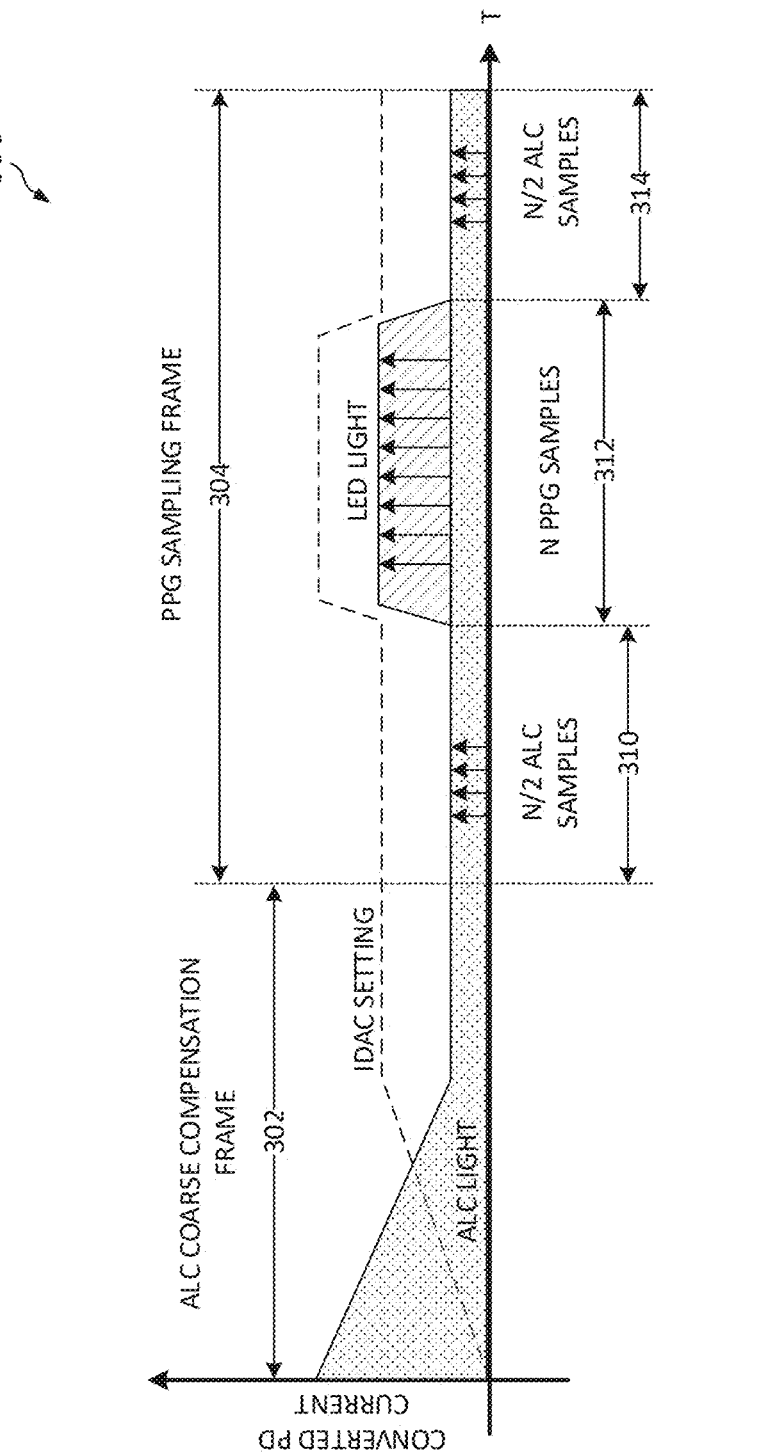
FIG. 3 is a timing diagram of an ambient light component cancelation and DC component reduction strategy, which may be implemented using a PPG circuit.

FIG. 3 illustrates a timing diagram of an ambient light component cancelation and DC component reduction strategy, which may be implemented using PPG circuit 126. In embodiments, PPG circuit 126 is configured to dynamically correct for the unwanted current contributions from the ambient light component 206 and the DC component 204 detected by detector 122.

The operation of sensor 106 is repeated in cycles. Each cycle entails two distinct frames. During the first frame, known as the ambient light component coarse compensation frame 302, the emitter 120 of sensor 106 is deactivated to prevent interference from the emitted light while sensing ambient light conditions.

Simultaneously, the PPG circuit 126 generates a dynamic compensation current to provide a coarse adjustment for the ambient light component 206 detected by detector 122. The settings of the PPG circuit 126, through a current DAC (IDAC), regulate the amount of compensation current, which can be determined using an algorithm, such as a Successive Approximation Register (SAR) algorithm. The algorithm helps determine the optimal compensation level by progressively converging on the correct current value.

The next operation phase, the PPG sampling frame 304, includes multiple portions. The first portion 310 occurs immediately before the pulse of emitted light from the emitter 120. In embodiments, during this portion, the residual ambient light component—the portion of ambient light not fully compensated by the dynamic compensation current from the ambient light component coarse compensation frame 302—is measured.

In embodiments, the residual ambient light measurement from the first portion 310 is subtracted from the overall signal detected during the PPG pulse in the second portion 312. This subtraction helps isolate the actual PPG signal (AC component 202 and DC component 204), which contains information on blood volume changes from the mixed signal (AC component 202, DC component 204, and ambient light component 206), including ambient light interference.

In embodiments, a third portion 314 occurs immediately after the pulse of the emitted light from the emitter 120. Similar to the first portion 310, during this portion, the residual ambient light component—the portion of ambient light not fully compensated by the dynamic compensation current from the ambient light component coarse compensation frame 302—is measured.

In embodiments, the residual ambient light measurement from the third portion 314 is subtracted from the overall signal detected during the PPG pulse in the second portion 312. This subtraction helps isolate the actual PPG signal (AC component 202 and DC component 204), which contains information on blood volume changes from the mixed signal (AC component 202, DC component 204, and ambient light component 206), including ambient light interference.

In embodiments, the residual ambient light measurements from the first portion 310 and the third portion 314 are averaged to generate an average residual ambient light measurement, which is more precise than each standalone measurement value. In embodiments, the average residual ambient light measurement is a linear interpretation of the samples from the first portion 310 and the third portion 314, at the time of the sampling of the PPG pulse, which allows to mitigate an error due to an eventual ambient light component variation.

Sensor 106 can more accurately capture biological signals with reduced contamination from the ambient light component 206 (i.e., external light sources) by employing this multi-step approach during each emission pulse and detection cycle.

Accordingly, the PPG circuit 126 employs a differential measurement technique, where two currents are measured: one representing the total detected current (PPG signal plus the residual ambient light component) during the PPG sampling frame 304 and the other isolated to represent solely the contribution from the residual ambient light component after the ALC coarse compensation frame 302. In embodiments, sensor 106 may include additional detectors (not shown) dedicated to measuring ambient light.

Based on the differential measurement, PPG circuit 126 generates a compensation current tailored to counterbalance the current from the ambient light component 206. As external lighting conditions fluctuate, the PPG circuit 126 dynamically tweaks the compensation current in real time. By emitting a current similar in magnitude but opposite in direction to that caused by the ambient light component 206, PPG circuit 126 neutralizes its contribution, refining the PPG signal. The resulting PPG signal has minimal artifacts caused by ambient lighting variations, significantly improving the precision and reliability of the derived physiological readings.

Further, the DC component 204 is partially offset by providing a dynamic current pulse through the PPG circuit 126 to enhance the detection of the AC component 202. The timing of the dynamic current pulse is synchronized with the emission of the light pulse from the emitter 120. Synchronization ensures that the DC component 204, which represents non-pulsatile or steady-state signals, is effectively mitigated. This allows for a more apparent distinction and measurement of the AC component 202, which corresponds to the pulsatile changes in blood volume with each heartbeat, thus providing a more accurate and reliable PPG signal for analysis.

A conventional approach to implement the IDAC of the PPG circuit 126 leverages current mirror circuits, which can be constructed using p-channel and n-channel metal-oxide-semiconductor (PMOS and NMOS) transistors. These transistors form the basis of the current mirrors by replicating the current from a reference branch into an output branch, allowing for scalable control. The PMOS and NMOS current mirror arrangements often include a trimming mechanism to dynamically adjust to the ambient light component 206.

However, this solution comes with inherent limitations. Specifically, using PMOS and NMOS current mirrors can lead to a slow response in PPG circuit 126. The speed at which the IDAC can adjust or settle to the desired current levels may not meet the requirements of applications where rapid changes in current are necessary, such as collecting the biomarkers.

Further, the conventional approach suffers from mismatch errors due to temperature variations. As the temperature fluctuates, the electrical characteristics of PMOS and NMOS transistors can drift differently, potentially leading to an imbalance between the two sides of the IDAC. Such mismatches can significantly impact the sensor's performance.

The primary advantage of utilizing a differential approach over a single-ended approach in isolating the PPG signal is its enhanced resistance to interference from the voltage supply. This benefit becomes particularly critical when dealing with a highly sensitive receiving chain. Furthermore, the differential approach holds the potential to double the dynamic range of the receiver. Implementing this method can result in some leniency in the precision requirements for the ADC and may somewhat diminish the need for stringent control over gain variation within the receiving chain.

In embodiments, an IDAC for a PPG circuit 126 is proposed that can dynamically compensate for current contributions detected from detector 122. Advantageously, the proposed IDAC can produce an output with reduced noise, exhibit prompt settling time, and maintain an extremely low current mismatch.

Aspects of this disclosure ensure compliance with the specifications demanded in critical health applications, achieving this with minimal noise introduction, rapid settling of current levels, and significantly reducing mismatches between the currents. In embodiments, the exclusive use of resistor elements in the IDAC of the PPG circuit 126 is proposed to achieve precise current matching centers. The inherent precision and consistency of resistors aid in equilibrating the current mirrors in the IDAC, maintaining the integrity of differential signaling.

In embodiments, a dedicated control loop mechanism is proposed to ensure that adjustments in current output are swift and accurate. This control mechanism enhances the IDAC's responsiveness, enabling it to adapt quickly to changes in input without compromising performance.

In embodiments, the noise factor, which predominantly arises from operational amplifiers (op-amps) and a reference voltage ($V_{REF}$), is addressed. While these components are recognized as significant contributors to the system's overall noise, their impact can be mitigated through design. By optimizing the design of op-amps and ensuring a stable $V_{REF}$, noise levels can be significantly reduced, resulting in a cleaner signal output from the PPG sensor. These and additional details are further detailed below.

Figure 4:
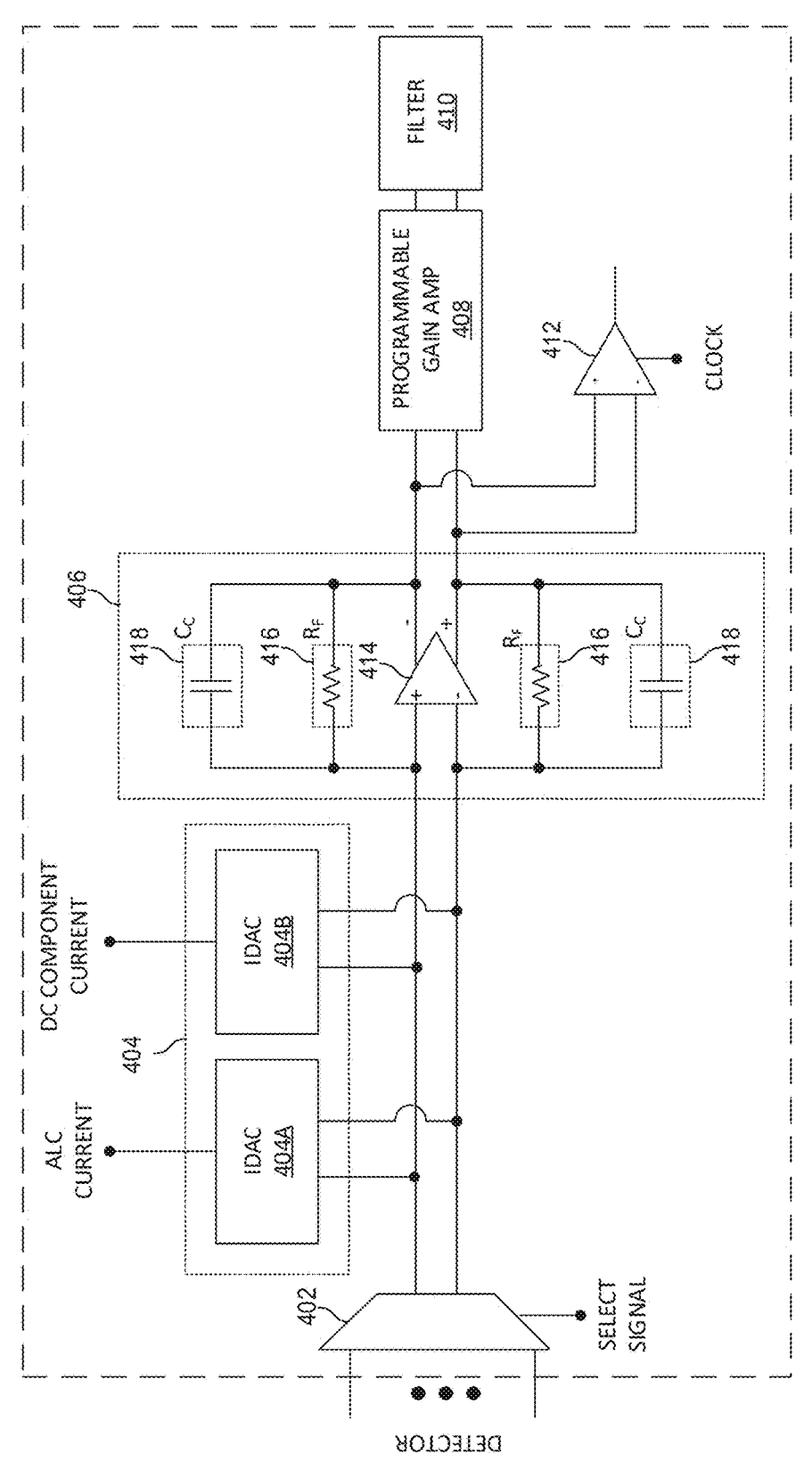
FIG. 4 is a schematic of an embodiment PPG circuit.

FIG. 4 illustrates a schematic of an embodiment PPG circuit 400, which may be implemented as the PPG circuit 126 in system 100. PPG circuit 400 includes a differential multiplexer 402, a first IDAC 404A, a second IDAC 404B, a gain stage 406, a programmable gain amplifier 408, a filter 410, and a differential comparator 412, which may (or may not) be arranged as shown. PPG circuit 400 may include additional components that are not shown, such as a dedicated controller and memory.

Differential multiplexer 402 is coupled to the output of the photodiodes of detector 122. It is configured to receive the differential electrical signals from each photodiode of detector 122 at a respective input. Differential multiplexer 402 includes a selection terminal configured to receive a select signal to select a pair of differential inputs (i.e., the differential electrical signals from a photodiode) and forward the differential signal to the first IDAC 404A, the second IDAC 404B, and the gain stage 406.

Each IDAC 404 is coupled to the differential output of the differential multiplexer 402. In embodiments, the arrangement of the first IDAC 404A and the second IDAC 404B are interchangeable. The first IDAC 404A is configured to generate a variable current to partially compensate for the ambient light component 206 detected by the detector 122 and a residual ambient light component to be subtracted from the electrical signal before the pulsing of the emitter 120. The second IDAC 404B is configured to generate a dynamic current pulse synchronized with the pulsing of the emitter 120 to compensate the DC component 204 partially and to increase the detectability of the AC component 202.

Gain stage 406 is configured to amplify the differential output of the differential multiplexer 402. In embodiments, the gain stage 406 is implemented as a transimpedance amplifier (TIA) gain stage. For example, gain stage 406 may include an operational amplifier (op-amp) 414, a pair of feedback resistors (RF) 416, and a pair of integration capacitors (Cc) 418.

Op-amp 414 is configured to convert the difference in current between its inverting and non-inverting inputs into voltage using a feedback network. Generally, it has a very high input impedance to minimize the current drawn from the signal source and a low output impedance to drive the next stage in the signal processing pipeline.

Feedback resistor (RF) 416 is coupled across the input and output of the op-amp 414. The value of the feedback resistors (RF) 416 determines the gain of the gain stage 406; the higher the resistance, the higher the gain (i.e., voltage output per unit of current input).

The integration capacitors (Cc) 418 concur to stabilize the TIA feedback loop and limit the bandwidth, reducing the high-frequency noise. They also determine the frequency response of the gain stage 406 and work with the feedback resistors (RF) 416 to set the poles of the transimpedance response.

Accordingly, the combination of the feedback resistors (RF) 416 and integration capacitors (Cc) 418 in parallel form an RC low-pass filter on each input of the op-amp 414. The RC low-pass filter helps stabilize the gain stage 406 by providing a phase margin and reducing any peaking in the frequency response. The differential configuration allows for common-mode noise rejection, which is beneficial in settings with significant environmental noise that affects both inputs similarly as it tends to be canceled out.

Programmable gain amplifier 408 is configured to electronically control the input signal's gain (i.e., amplification factor). This is typically achieved through digital control signals that adjust the gain to predefined levels. Having programmable gain is beneficial in signal processing applications where it is necessary to normalize varying signal levels or to amplify weak signals for better sensor or data acquisition performance. In embodiments, programmable gain amplifier 408 is configured to switch between two predefined gain levels.

In embodiments, filter 410 is a low-pass or low-pass anti-aliasing filter configured to limit the bandwidth of an input signal to less than half the sampling rate. The purpose of an anti-aliasing filter is to prevent aliasing, which can occur when a signal is sampled at a rate lower than its highest frequency component. Aliasing results in the distortion of the sampled signal, which can lead to misinterpretation of the signal frequency when it is reconstructed from its samples.

Accordingly, the programmable gain amplifier 408 amplifies the signal voltage at the output of the gain stage 406, and the resulting output is filtered through the filter 410 to eliminate any high-frequency components that could cause aliasing when the signal is subsequently digitized by an Analog-to-Digital Converter (ADC).

The differential voltage signal at the output of the gain stage 406 is provided to the inverting and non-inverting inputs of the differential comparator 412. Specifically, the negative side of the differential voltage signal is provided to the non-inverting input of the differential comparator, and the positive side is provided to the inverting input of the differential comparator 412.

The differential comparator 412 is configured to produce an output signal synchronized with the clock signal used to operate the pulsing of the emitter 120. The differential comparator 412 is configured to compare the positive and negative sides of the differential voltage signal and produce the output signal based on their relative magnitudes.

For example, if the voltage of the negative side of the differential signal (applied to the non-inverting input) exceeds the voltage of the positive side (applied to the inverting input), the output of the differential comparator 412 switches to a high state. In embodiments, the high output level approaches the positive supply voltage of the differential comparator 412.

Conversely, if the voltage on the positive side of the differential signal is greater than that on the negative side, then the output of the differential comparator 412 switches to a low state. In embodiments, the low output level approaches the voltage level near the ground reference or the negative supply voltage of the differential comparator 412.

The switching point where the output signal changes state corresponds to the point when the voltages at both inputs are approximately equal. The output signal of the differential comparator 412 is then used to coarse-adjust the ambient light component 206 during the ambient light component coarse compensation frame 302.

Generally, a differential IDAC faces several challenges when used to cancel the ambient light and the DC component of a PPG signal. Embodiments of this disclosure propose an IDAC that addresses each of these challenges.

It would be advantageous for the IDAC to address the issue of low current mismatch. The high transimpedance gain, potentially up to 1 MΩ, in the receiver chain requires a minimal current mismatch to avert output voltage offset; a mismatch of merely 1 µA could induce a 1 V offset.

Further, it would be advantageous for the IDAC to provide a higher current capability (e.g., 320 µA or higher) to cater to ambient light component cancellation and DC component mitigation. This current capability with low mismatch is to be maintained consistently across varying temperatures.

Moreover, it would be advantageous to address the ambient light and DC components independently, each controllable and tunable separately.

Furthermore, the LED pulses in PPG signals have rise and fall times in the microsecond range. Therefore, having an IDAC with a rapid settling time would be advantageous to ensure signal integrity.

Additionally, the incorporation of additional current from the IDAC introduces new noise at the input of the receiver chain. Mitigating this noise would be advantageous, as it directly impacts the signal's quality and the system's overall performance.

The compensation of the DC PPG component is typically realized by applying a current pulse synchronized with the LED pulse. The current pulse is generally chosen by the user, and no particular algorithm is applied.

Figure 5:
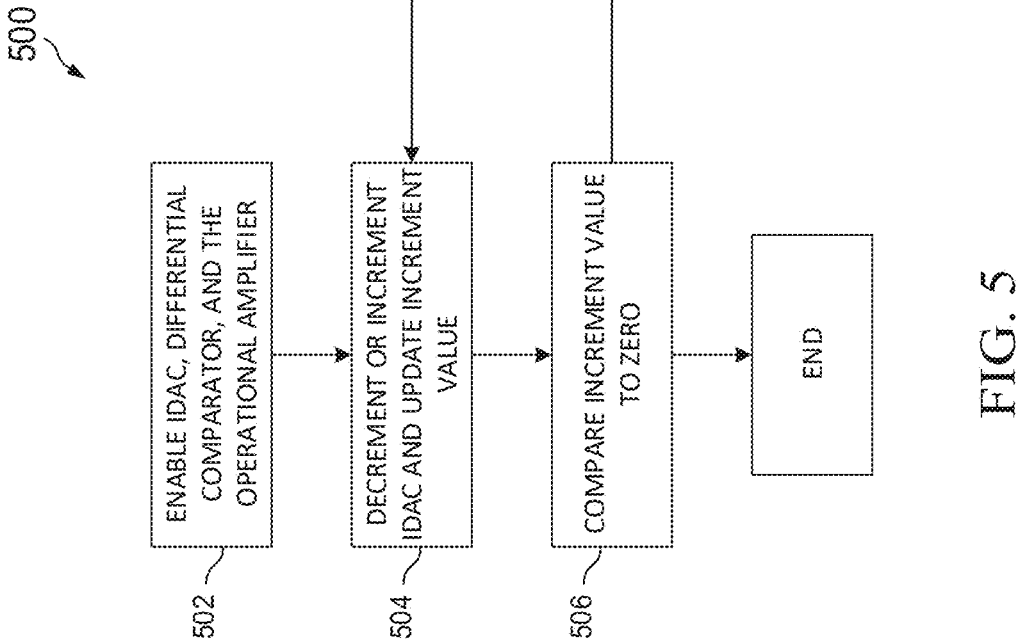
FIG. 5 is a flowchart of an embodiment method for compensating the ambient light component.

FIG. 5 illustrates a flowchart of an embodiment method 500 for compensating the ambient light component 206. It is noted that all steps outlined in the flowchart of method 500 are not necessarily required and can be optional. Further, changes to the arrangement of the steps, removal of one or more steps and path connections, and addition of steps and path connections are similarly contemplated.

At step 502, the first IDAC 404A for the coarse compensation, the differential comparator 412, and the op-amp 414 are enabled. In embodiments, the first IDAC 404A is set to $2^{N-1}$, where the first IDAC 404A has N-bits for setting the ambient light component PPC coarse compensation. In embodiments, the first IDAC 404A is set to give half-current.

At step 504, in response to the output of the differential comparator 412 being at a logic level high, the first IDAC 404A is decremented or incremented by a defined step value. In embodiments, the defined step value is initially set to $2^{N-2}$ for the N-bit IDAC. The new step value is updated to equal $$\frac{\text{previous step value}}{2},$$

corresponding to a right binary shift. The new step value is at any iteration added or subtracted to the current IDAC setting in response to the output of the differential comparator 412 until the new step is shifted to zero, completing the SAR algorithm.

At the end of the SAR algorithm, the differential comparator 412 is disabled.

Figure 6:
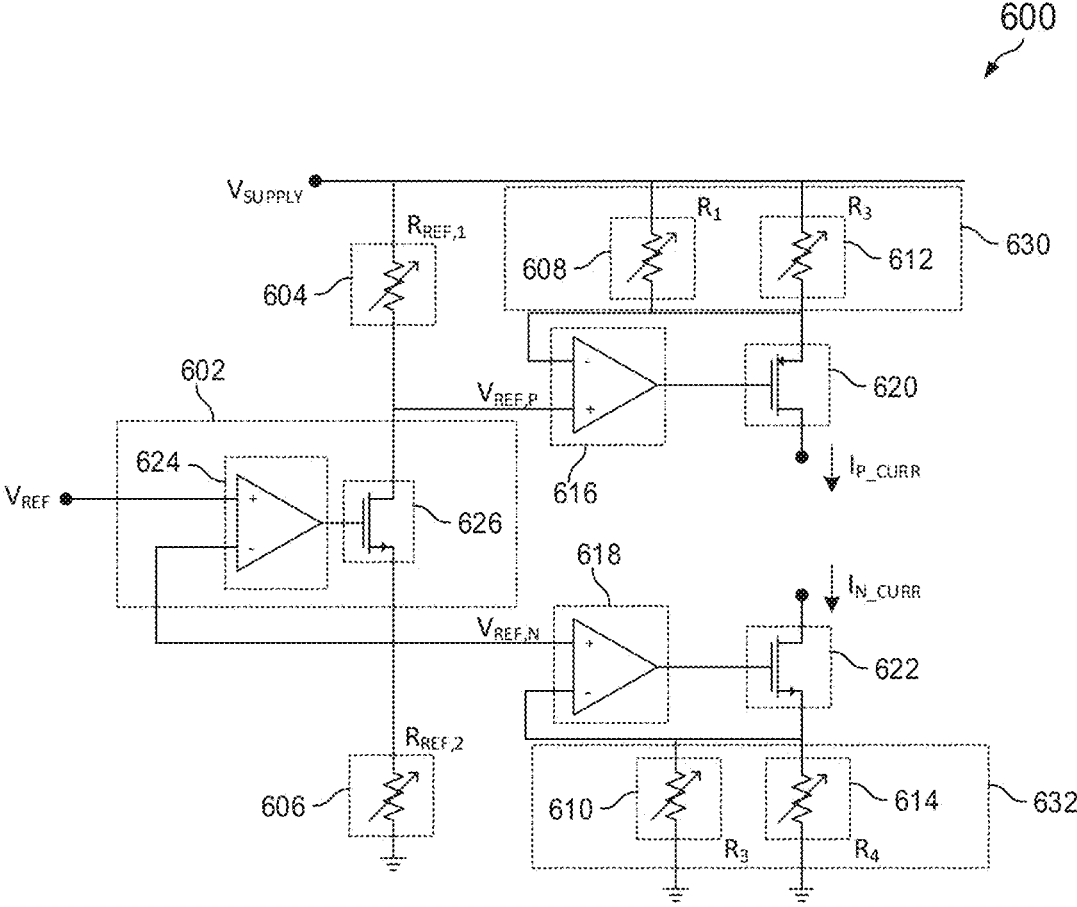
FIG. 6 is a schematic of an embodiment IDAC 600.

FIG. 6 illustrates a schematic of an embodiment IDAC 600, which may be implemented as the first IDAC 404A and the second IDAC 404B in the PPG circuit 400. IDAC 600 includes a common current reference ($I_{REF}$) 602, a first reference resistor ($R_{REF,1}$) 604, a second reference resistor ($R_{REF,2}$) 606, a first variable resistor ($R_1$) 608, a second variable resistor ($R_2$) 610, a third variable resistor ($R_3$) 612, a fourth variable resistor ($R_4$) 614, a first operational amplifier 616, a second operational amplifier 618, a p-channel transistor 620, and an n-channel transistor 622, which may (or may not) be arranged as shown. IDAC 600 may include additional components that are not shown. In embodiments, the first reference resistor ($R_{REF,1}$) 604 and the second reference resistor ($R_{REF,2}$) 606 are variable resistors.

In embodiments, the common current reference ($I_{REF}$) 602 is implemented using an operational amplifier 624 and an n-channel transistor 626. The operational amplifier 624 is configured to receive a low-noise reference voltage ($V_{REF}$) at its non-inverting input. The inverting input of the operational amplifier 624 is coupled to the source terminal of the n-channel transistor 626. The common current reference ($I_{REF}$) 602 achieves refinement through a voltage-to-current conversion by exploiting the low-noise reference voltage ($V_{REF}$). The control loop of the common current reference ($I_{REF}$) 602 helps achieve rapid settling times compared to the conventional approach.

In embodiments, the common current reference ($I_{REF}$) 602 is implemented using a reference current and a current mirror. In such embodiments, the current can be imposed through the current mirror with a resistive degeneration.

A first terminal of the first reference resistor ($R_{REF,1}$) 604 is coupled to a voltage rail that supplies a voltage source (VSUPPLY). A second terminal of the first reference resistor ($R_{REF,1}$) 604 is coupled to the common current reference ($I_{REF}$) 602 (i.e., the drain terminal of the n-channel transistor 626) and the non-inverting input of the first operational amplifier 616.

A first terminal of the second reference resistor ($R_{REF,2}$) 606 is coupled to the common current reference ($I_{REF}$) 602 (i.e., the source terminal of the n-channel transistor 626) and the non-inverting input of the second operational amplifier 618. A second terminal of the second reference resistor ($R_{REF,2}$) 606 is coupled to the reference ground.

Through the common current reference ($I_{REF}$) 602 and the first reference resistor ($R_{REF,1}$) 604, the non-inverting input of the first operational amplifier 616 receives a positive reference voltage ($V_{REF,P}$). Through the common current reference ($I_{REF}$) 602 and the second reference resistor ($R_{REF,2}$) 606, the non-inverting input of the second operational amplifier 618 receives a negative reference voltage ($V_{REF,N}$).

The output of the first operational amplifier 616 is coupled to the gate terminal of the p-channel transistor 620, and the output of the second operational amplifier 618 is coupled to the gate terminal of the n-channel transistor 622.

The first reference resistor ($R_{REF,1}$) 604, the second reference resistor ($R_{REF,2}$) 606, the first variable resistor ($R_1$) 608, the second variable resistor ($R_2$) 610, the third variable resistor ($R_3$) 612, and the fourth variable resistor ($R_4$) 614 are configured to provide current matching at the positive and negative sides of the differential signal, which was conventionally provided by transistor current mirrors.

In embodiments, the first reference resistor ($R_{REF,1}$) 604 and the second reference resistor ($R_{REF,2}$) 606 are fine-tuned to reduce the mismatch between the positive and the negative output currents (including the current component due to the offset from the operational amplifiers 616 and 618).

In embodiments, the first reference resistor ($R_{REF,1}$) 604 and the second reference resistor ($R_{REF,2}$) 606 are fine-tuned and set during production. In embodiments, the first reference resistor ($R_{REF,1}$) 604 and the second reference resistor ($R_{REF,2}$) 606 are fine-tuned during a calibration run of the system 100 at, for example, startup.

The first variable resistor ($R_1$) 608 and the third variable resistor ($R_3$) 612 form two independent current sources 630. The first variable resistor ($R_1$) 608 and the third variable resistor ($R_3$) 612 are arranged in parallel, having a first common terminal coupled to the voltage supply rail of the voltage source and a second common terminal coupled to the source terminal of the p-channel transistor 620 and the inverting input of the first operational amplifier 616.

The second variable resistor ($R_3$) 610 and the fourth variable resistor ($R_4$) 614 form a second pair of current sources 632. The second variable resistor ($R_2$) 610 and the fourth variable resistor ($R_4$) 614 are arranged in parallel, having a first common terminal coupled to the reference ground and a second common terminal coupled to the source terminal of the n-channel transistor 622 and the inverting input of the second operational amplifier 618.

In embodiments, the first variable resistor ($R_1$) 608, the second variable resistor ($R_2$) 610, the third variable resistor ($R_3$) 612, and the fourth variable resistor ($R_4$) 614 are equivalent variable resistors, mainly realized as sequences of the same unitary resistive element. In embodiments, the first variable resistor ($R_1$) 608, the second variable resistor ($R_2$) 610, the third variable resistor ($R_3$) 612, and the fourth variable resistor ($R_4$) 614 provide a parallel combination of equal switchable resistors that can be driven using a digital code. In embodiments, switchable resistors maximize the matching in the circuit.

As each of the first variable resistor ($R_1$) 608, the second variable resistor ($R_2$) 610, the third variable resistor ($R_3$) 612, and the fourth variable resistor ($R_4$) 614 are variable resistors, the value of the resistance can be adjusted. In embodiments, the resistors are switchable resistors configured to receive a respective digital code indicating the resistance value of the respective resistor. By adjusting the resistance of each of the resistors in the first current source 630 and the second current source 632 using control signals generated by a microcontroller or the processor 102 of the host device, the current flowing through the current dividers can be adjusted.

The first current source 630 and the second current source 632 facilitate compensation for the ambient light component 206 and DC component 208 of the PPG signal through the drain terminals of the p-channel transistor 620 and the n-channel transistor 622.

Various factors can influence noise levels, such as the operational amplifiers, resistors, and low-noise voltage reference ($V_{REF}$). The first reference resistor ($R_{REF,1}$) 604 and the second reference resistor ($R_{REF,2}$) 606 contribute a predictable current noise amount, which is inversely proportional to resistance values based on the formula $$\sqrt{\frac{4k_B T}{R}},$$

where $k_B$ is the Boltzmann constant, T is the absolute temperature in kelvins, and R is the resistance in ohms.

The noise emanating from the positive reference voltage ($V_{REF,P}$) and produced by the first operational amplifier 616 is reported on the second common terminal of the first current source 630 (also coupled to the source terminal of the p-channel transistor 620 and the inverting input of the first operational amplifier 616). The noise is then divided by the equivalent resistance in first current source 630.

Likewise, the noise emanating from the negative reference voltage ($V_{REF,N}$) and produced by the second operational amplifier 618 is reported on the second common terminal of the second current source 632 (also coupled to the source terminal of the n-channel transistor 622 and the inverting input of the second operational amplifier 618). The noise is then divided by the equivalent resistance in second current source 632.

In embodiments, IDAC 600, the arrangement of the circuit components ensures that the voltage drop across the first current source 630 and the second current source 632 is equal to the positive reference voltage ($V_{REF,P}$) and the negative reference voltage ($V_{REF,N}$), respectively. The control loop, and in particular its bandwidth, dictates that the voltage drop is not static. Instead, it possesses dynamic characteristics that mirror the fluctuations found in the positive reference voltage ($V_{REF,P}$) and the negative reference voltage ($V_{REF,N}$). This mirroring includes the ability to follow the intentional variations of the positive reference voltage ($V_{REF,P}$) and the negative reference voltage ($V_{REF,N}$), as well as any inherent noise. Thus, any changes in the positive reference voltage ($V_{REF,P}$) and the negative reference voltage ($V_{REF,N}$), whether part of its design or unintentional disturbances, are reflected in the voltage drop across these resistors within IDAC 600.

Current noise levels correspond to output current intensity, while voltage follower noise within the control loop bandwidth is usually negligible.

The temperature dependence primarily emerges from operational amplifiers' gain and offset value variations, which can be selected to reduce temperature dependencies. In embodiments, the first operational amplifier 616, the second operational amplifier 618, or both are implemented using a two-stage class A amplifier topology to provide low-noise, high-gain, low-offset with reduced temperature dependency.

A first aspect relates to a differential current digital to analog converter (IDAC). The differential IDAC comprises a first reference resistor coupled to a voltage supply rail; a second reference resistor coupled to reference ground; a reference current source arranged between the first reference resistor and the second reference resistor; a first variable resistor coupled to the voltage supply rail, the first variable resistor having a first resistance value based on a first digital code; a second variable resistor coupled to the voltage supply rail, the second variable resistor having a second resistance value based on a second digital code; a p-channel transistor configured to source a first output current from the first variable resistor to a first output terminal; an n-channel transistor configured to source a second output current from the second variable resistor to a second output terminal; a first amplifier configured to cause a first voltage across the first variable resistor to equal a first voltage across the first reference resistor; and a second amplifier configured to cause a second voltage across the second variable resistor to equal a second voltage across the second reference resistor.

In a first implementation form of the IDAC, according to the first aspect as such, the reference current source comprises an operational amplifier and a second n-channel transistor.

In a second implementation form of the IDAC, according to the first aspect as such or any preceding implementation form of the first aspect, the operational amplifier is configured to receive a low-noise reference voltage at a non-inverting input of the operational amplifier.

In a third implementation form of the IDAC, according to the first aspect as such or any preceding implementation form of the first aspect, an inverting input of the operational amplifier is coupled to the non-inverting input of the second amplifier.

In a fourth implementation form of the IDAC, according to the first aspect as such or any preceding implementation form of the first aspect, a drain terminal of the second n-channel transistor is coupled to the first reference resistor, a source terminal of the second n-channel transistor is coupled to the second reference resistor, and a control terminal of the second n-channel transistor is coupled to an output of the operational amplifier.

In a fifth implementation form of the IDAC, according to the first aspect as such or any preceding implementation form of the first aspect, currents flowing at a drain terminal of the p-channel transistor and a drain terminal of the n-channel transistor provide compensation current to reduce an ambient light component of an electrical signal corresponding to a photoplethysmography (PPG) signal measurement.

In a sixth implementation form of the IDAC, according to the first aspect as such or any preceding implementation form of the first aspect, the electrical signal corresponds to a light signal passed through or reflected from body issue that is collected for the photoplethysmography (PPG) signal measurement.

A second aspect relates to a system that includes a detector configured to capture light and generate an electrical signal: a photoplethysmography (PPG) circuit coupled to the detector, the PPG circuit configured to receive the electrical signal and generate compensation current for ambient light components of the electrical signal, the PPG circuit comprising: a first reference resistor coupled to a voltage supply rail; a second reference resistor coupled to reference ground; a reference current source arranged between the first reference resistor and the second reference resistor; a first variable resistor coupled to the voltage supply rail, the first variable resistor having a first resistance value based on a first digital code; a second variable resistor coupled to the voltage supply rail, the second variable resistor having a second resistance value based on a second digital code; a p-channel transistor configured to source a first output current from the first variable resistor to a first output terminal; an n-channel transistor configured to source a second output current from the second variable resistor to a second output terminal; a first amplifier configured to cause a first voltage across the first variable resistor to equal a first voltage across the first reference resistor; and a second amplifier configured to cause a second voltage across the second variable resistor to equal a second voltage across the second reference resistor.

In a first implementation form of the system, according to the second aspect as such, the light captured by the detector is passed through body tissue.

In a second implementation form of the system, according to the second aspect as such or any preceding implementation form of the second aspect, the light captured by the detector is reflected from body tissue.

In a third implementation form of the system, according to the second aspect as such or any preceding implementation form of the second aspect, the reference current source comprises an operational amplifier and a second n-channel transistor, wherein the operational amplifier is configured to receive a low-noise reference voltage at a non-inverting input of the operational amplifier, and wherein an inverting input of the operational amplifier is coupled to the non-inverting input of the second amplifier.

In a fourth implementation form of the system, according to the second aspect as such or any preceding implementation form of the second aspect, a drain terminal of the second n-channel transistor is coupled to the first reference resistor, a source terminal of the second n-channel transistor is coupled to the second reference resistor, and a control terminal of the second n-channel transistor is coupled to an output of the operational amplifier.

In a fifth implementation form of the system, according to the second aspect as such or any preceding implementation form of the second aspect, currents flowing at a drain terminal of the p-channel transistor and a drain terminal of the n-channel transistor provide the compensation current to reduce an ambient light component of the electrical signal corresponding to a photoplethysmography (PPG) signal measurement.

In a sixth implementation form of the system, according to the second aspect as such or any preceding implementation form of the second aspect, the electrical signal corresponds to a light signal passed through or reflected from body issue that is collected for the PPG signal measurement.

A third aspect relates to a method to generate a differential current to reduce an ambient light component in an electrical signal corresponding to a photoplethysmography (PPG) signal measurement. The method includes sourcing, by a p-channel transistor, a first output current from a first variable resistor to a first output terminal, the first variable resistor coupled to a voltage supply rail, the first variable resistor having a first resistance value based on a first digital code; sourcing, by an n-channel transistor, a second output current from a second variable resistor to a second output terminal, the second variable resistor coupled to the voltage supply rail, the second variable resistor having a second resistance value based on a second digital code; setting, by a first amplifier, a first voltage across the first variable resistor to equal a first voltage across a first reference resistor, the first reference resistor coupled to the voltage supply rail; and setting, by a second amplifier, a second voltage across the second variable resistor equal a second voltage across a second reference resistor, the second reference resistor coupled to reference ground, a reference current source arranged between the first reference resistor and the second reference resistor.

In a first implementation form of the method, according to the third aspect as such, the reference current source comprises an operational amplifier and a second n-channel transistor.

In a second implementation form of the method, according to the third aspect as such or any preceding implementation form of the third aspect, the operational amplifier is configured to receive a low-noise reference voltage at a non-inverting input of the operational amplifier, and wherein an inverting input of the operational amplifier is coupled to the non-inverting input of the second amplifier.

In a third implementation form of the method, according to the third aspect as such or any preceding implementation form of the third aspect, a drain terminal of the second n-channel transistor is coupled to the first reference resistor, a source terminal of the second n-channel transistor is coupled to the second reference resistor, and a control terminal of the second n-channel transistor is coupled to an output of the operational amplifier.

In a fourth implementation form of the method, according to the third aspect as such or any preceding implementation form of the third aspect, currents flowing at a drain terminal of the p-channel transistor and a drain terminal of the n-channel transistor provide a compensation current to reduce the ambient light component of the electrical signal corresponding to the PPG signal measurement.

In a fifth implementation form of the method, according to the third aspect as such or any preceding implementation form of the third aspect, the electrical signal corresponds to a light signal passed through or reflected from body issue that is collected for the PPG signal measurement.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A differential current digital to analog converter (IDAC), the differential IDAC comprising:
   a first reference resistor coupled to a voltage supply rail;
   a second reference resistor coupled to reference ground;
   a reference current source arranged between the first reference resistor and the second reference resistor;
   a first variable resistor coupled to the voltage supply rail, the first variable resistor having a first resistance value based on a first digital code;

a second variable resistor coupled to the voltage supply rail, the second variable resistor having a second resistance value based on a second digital code;

a p-channel transistor configured to source a first output current from the first variable resistor to a first output terminal;

an n-channel transistor configured to source a second output current from the second variable resistor to a second output terminal;

a first amplifier configured to cause a first voltage across the first variable resistor to equal a first voltage across the first reference resistor; and a second amplifier configured to cause a second voltage across the second variable resistor to equal a second voltage across the second reference resistor.

2. The IDAC of claim 1, wherein the reference current source comprises an operational amplifier and a second n-channel transistor.

3. The IDAC of claim 2, wherein the operational amplifier is configured to receive a low-noise reference voltage at a non-inverting input of the operational amplifier.

4. The IDAC of claim 3, wherein an inverting input of the operational amplifier is coupled to the non-inverting input of the second amplifier.

5. The IDAC of claim 2, wherein a drain terminal of the second n-channel transistor is coupled to the first reference resistor, a source terminal of the second n-channel transistor is coupled to the second reference resistor, and a control terminal of the second n-channel transistor is coupled to an output of the operational amplifier.

6. The IDAC of claim 1, wherein currents flowing at a drain terminal of the p-channel transistor and a drain terminal of the n-channel transistor provide compensation current to reduce an ambient light component of an electrical signal corresponding to a photoplethysmography (PPG) signal measurement.

7. The IDAC of claim 6, wherein the electrical signal corresponds to a light signal passed through or reflected from body tissue that is collected for the photoplethysmography (PPG) signal measurement.

8. A system, comprising:

a detector configured to capture light and generate an electrical signal:

a photoplethysmography (PPG) circuit coupled to the detector, the PPG circuit configured to receive the electrical signal and generate compensation current for ambient light components of the electrical signal, the PPG circuit comprising:

a first reference resistor coupled to a voltage supply rail;

a second reference resistor coupled to reference ground;

a reference current source arranged between the first reference resistor and the second reference resistor;

a first variable resistor coupled to the voltage supply rail, the first variable resistor having a first resistance value based on a first digital code;

a second variable resistor coupled to the voltage supply rail, the second variable resistor having a second resistance value based on a second digital code;

a p-channel transistor configured to source a first output current from the first variable resistor to a first output terminal;

an n-channel transistor configured to source a second output current from the second variable resistor to a second output terminal;

a first amplifier configured to cause a first voltage across the first variable resistor to equal a first voltage across the first reference resistor; and a second amplifier configured to cause a second voltage across the second variable resistor to equal a second voltage across the second reference resistor.

9. The system of claim 8, wherein the light captured by the detector is passed through body tissue.

10. The system of claim 8, wherein the light captured by the detector is reflected from body tissue.

11. The system of claim 8, wherein the reference current source comprises an operational amplifier and a second n-channel transistor, wherein the operational amplifier is configured to receive a low-noise reference voltage at a non-inverting input of the operational amplifier, and wherein an inverting input of the operational amplifier is coupled to the non-inverting input of the second amplifier.

12. The system of claim 11, wherein a drain terminal of the second n-channel transistor is coupled to the first reference resistor, a source terminal of the second n-channel transistor is coupled to the second reference resistor, and a control terminal of the second n-channel transistor is coupled to an output of the operational amplifier.

13. The system of claim 8, wherein currents flowing at a drain terminal of the p-channel transistor and a drain terminal of the n-channel transistor provide the compensation current to reduce an ambient light component of the electrical signal corresponding to a photoplethysmography (PPG) signal measurement.

14. The system of claim 13, wherein the electrical signal corresponds to a light signal passed through or reflected from body tissue that is collected for the PPG signal measurement.

15. A method to generate a differential current to reduce an ambient light component in an electrical signal corresponding to a photoplethysmography (PPG) signal measurement, the method comprising:

sourcing, by a p-channel transistor, a first output current from a first variable resistor to a first output terminal, the first variable resistor coupled to a voltage supply rail, the first variable resistor having a first resistance value based on a first digital code;

sourcing, by an n-channel transistor, a second output current from a second variable resistor to a second output terminal, the second variable resistor coupled to the voltage supply rail, the second variable resistor having a second resistance value based on a second digital code;

setting, by a first amplifier, a first voltage across the first variable resistor to equal a first voltage across a first reference resistor, the first reference resistor coupled to the voltage supply rail; and setting, by a second amplifier, a second voltage across the second variable resistor equal to a second voltage across a second reference resistor, the second reference resistor coupled to reference ground, a reference current source arranged between the first reference resistor and the second reference resistor.

16. The method of claim 15, wherein the reference current source comprises an operational amplifier and a second n-channel transistor.

17. The method of claim 16, wherein the operational amplifier is configured to receive a low-noise reference voltage at a non-inverting input of the operational amplifier, and wherein an inverting input of the operational amplifier is coupled to the non-inverting input of the second amplifier.

18. The method of claim 17, wherein a drain terminal of the second n-channel transistor is coupled to the first reference resistor, a source terminal of the second n-channel transistor is coupled to the second reference resistor, and a control terminal of the second n-channel transistor is coupled to an output of the operational amplifier.

19. The method of claim 15, wherein currents flowing at a drain terminal of the p-channel transistor and a drain terminal of the n-channel transistor provide a compensation current to reduce the ambient light component of the electrical signal corresponding to the PPG signal measurement.

20. The method of claim 15, wherein the electrical signal corresponds to a light signal passed through or reflected from body tissue that is collected for the PPG signal measurement.

* * * * *